United States Patent [19]

Johnson et al.

[11] Patent Number: 4,555,152
[45] Date of Patent: Nov. 26, 1985

[54] LEADLESS INTEGRATED CIRCUIT CONNECTOR

[75] Inventors: Donald L. Johnson, Olivenhain; Lowell R. Lingenfelter, La Jolla, both of Calif.

[73] Assignee: Teledyne Industries, Inc., Los Angeles, Calif.

[21] Appl. No.: 535,849

[22] Filed: Sep. 26, 1983

[51] Int. Cl.⁴ ............................................. H01R 23/70
[52] U.S. Cl. ............................ 339/17 L; 339/17 CF; 339/258 P
[58] Field of Search ............ 339/17 CF, 17 L, 17 LC, 339/17 LM, 17 M, 176 MP, 95 R, 95 B, 258 R, 258 P, 256 R, 218 R, 218 M

[56] References Cited

U.S. PATENT DOCUMENTS

| | | | |
|---|---|---|---|
| 2,695,390 | 11/1954 | Woolston et al. | 339/95 R |
| 3,152,856 | 10/1964 | Batcheller | 339/95 R |
| 3,399,372 | 8/1968 | Uberbacher | 339/17 L |
| 3,787,801 | 1/1974 | Teagno et al. | 339/258 R |
| 4,210,376 | 7/1980 | Hughes et al. | 339/17 LC |
| 4,264,114 | 4/1981 | Chandler | 339/17 LC |

Primary Examiner—Neil Abrams
Attorney, Agent, or Firm—Reagin & King

[57] ABSTRACT

A device for connecting an integrated circuit to a circuit board having a body of insulating material with a first surface adapted to fit flush against a circuit board, a second surface adjacent the first surface having a series of parallel grooves, and a third surface. Each of a series of parallel conductors is molded into a central portion of the body of insulating material and is bent to fit into one of the grooves in a manner that the insulating material underlying the bend is forced tightly thereagainst and the portion of the body which is grooved is forced tightly against the remaining portion of the conductor. The conductors protrude at one end from the first surface for connection to a circuit board and at the other end lie alongside the third surface and are bent to provide a spring to hold and make contact with a leadless flat circuit interposed between the conductors and the third surface.

3 Claims, 8 Drawing Figures

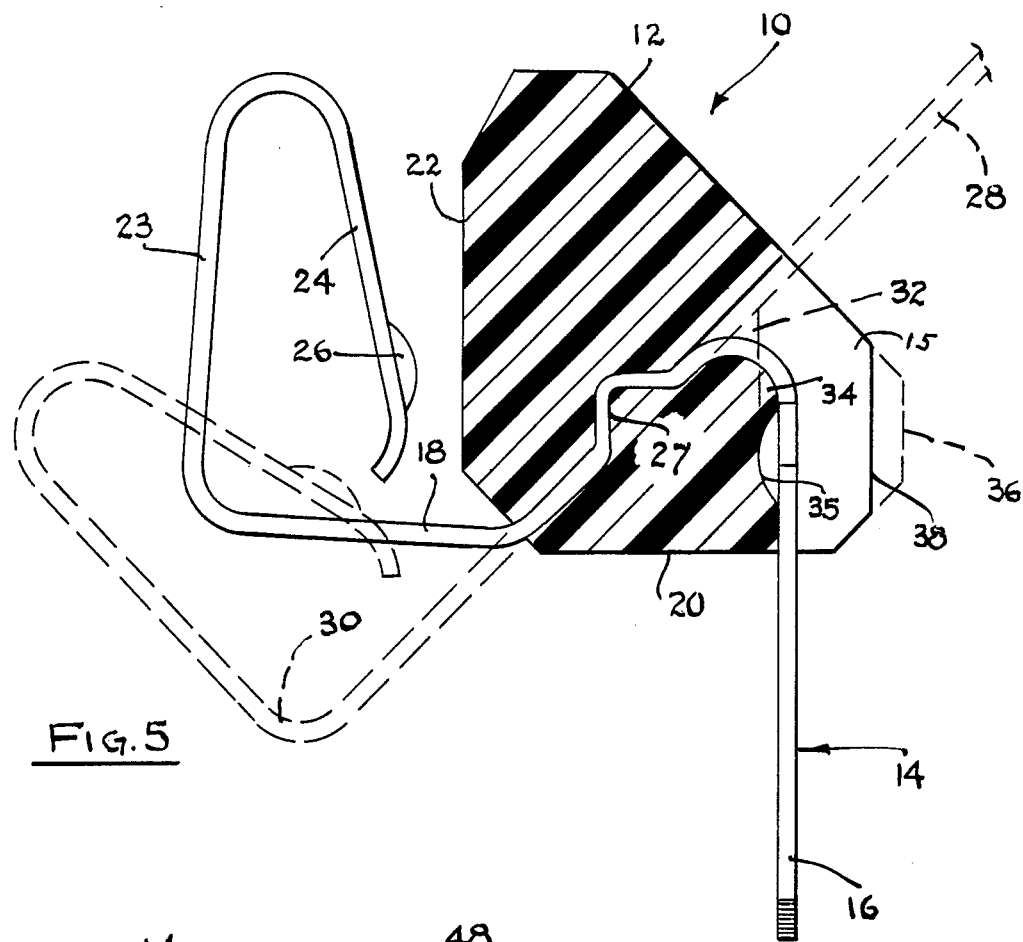
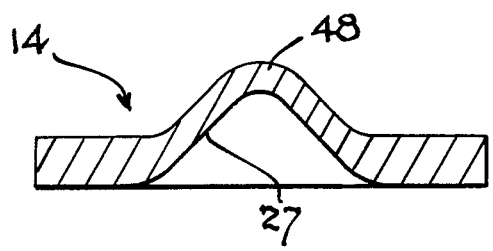
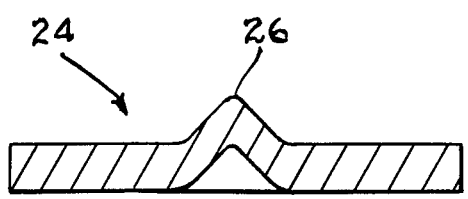
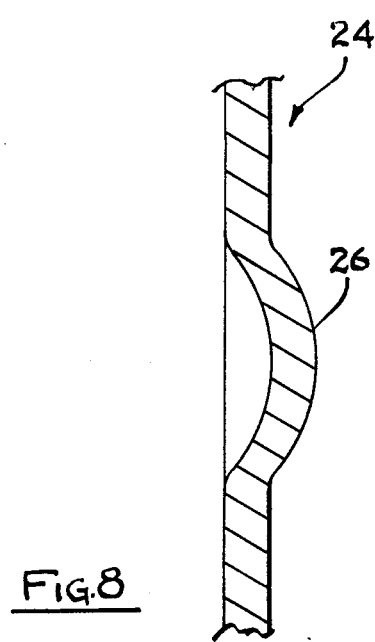

4,555,152

LEADLESS INTEGRATED CIRCUIT CONNECTOR

BACKGROUND OF THE INVENTION

This invention relates to connectors and, more particularly, to an improved device for connecting leadless integrated circuits to circuit boards.

There have been any number of devices conceived for connecting electrical circuit portions to one another. As integrated circuits have become smaller while including more individual components, such circuits have become less expensive. Consequently, there has been a tendency to replace the circuitry existing in commonly encountered electronic devices (such as radios) by integrated circuitry. The general environment in which many such electronic devices are used is quite rugged. For example, portable radios are carried and often dropped, automoblie radios are subjected to substantial and continuous vibrations and shock, and other circuitry is treated in a like manner. Consequently, it is desirable that the arrangement for connecting such integrated circuits to other circuitry both secure the integrated circuitry and allow the replacement of any circuitry which is damaged.

Many connectors for completing the electrical circuits between integrated circuits and circuit boards accomplish these desired ends but at great expense.

It is, therefore, an object of the present invention to provide an improved connector for leadless integrated circuits.

It is another object of the present invention to provide a connector for fixing integrated circuits to circuit boards which furnishes an especially secure mechanical connection between the two circuit portions.

It is another object of the invention to provide an improved leadless integrated circuit connector which is especially inexpensive.

It is an additional object of this invention to improve the connection made between leadless integrated circuits and connectors thereto.

SUMMARY OF THE INVENTION

These and other objects are accomplished in the present invention by a connector for making connections between plated wiring on a mother board and solder plated tabs on an integrated circuit substrate. The connector includes a body of molded insulating material through which project a number of conductive leads. The leads are bent into position for connecting to a mother board in such a manner that the insulative material of the body is drawn tightly about the leads on one side. The body is then compressed so that it holds the leads very firmly. A soldered connection to these leads at the mother board renders the entire arrangement of connector and mother board essentially one solid physical structure having little tendency to set up secondary vibrations internal to the connector in response to shocks. Enhancing the strength of the arrangement is a new type of connector contact point which provides in conjunction with the non-conductive body of the connector an especially good mechanical connection of the conductive leads which is unlikely to be disturbed by mechnical forces. The contact point is designed to have a very high contacting pressure on a small surface area of the solder plated tabs of the integrated circuit substrate.

Other objects, features, and advantages of the invention will become apparent by reference to the specification taken in conjunction with the drawings in which like elements are referred to by like reference characters throughout the several views.

BRIEF DESCRIPTION OF THE DRAWINGS

FIG. 5 is a side view of the invention shown in FIG. 2 in cross section through a single one of the individual conductive leads;

FIG. 6 is a cross section of a locking point detail of a single lead as utilized in the invention;

FIG. 7 is a cross section of a detail of a contact used on a conductor of the invention shown in FIG. 2; and FIG. 8 is another cross section of the terminal shown in FIG. 7, but rotated 90 degrees.

DESCRIPTION OF THE PREFERRED EMBODIMENT

Figure 1:
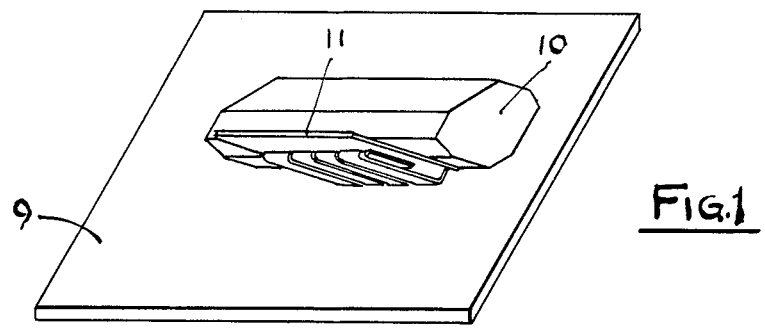
FIG. 1 is a perspective view of a connector constructed in accordance with the invention mounted to a mother board and mounting an integrated circuit.

FIG. 1 is a perspective view showing a mother board 9 mounting a connector 10 constructed in accordance with the invention. The connector 10 holds and makes contact to leadless integrated circuit 11 which may typically include a ceramic substrate having a series of generally rectangular metallic solder plated pads along one side to which connections are made. Clearly, the circuit 11 might be other than an integrated circuit and the connector 10 would function as well for any leadless flat circuit.

FIGS. 2, 3, 4, and 5 are top, rear, front, and side cross sectional views, respectively, of the connector 10 of FIG. 1 constructed in accordance with the invention.

Figure 2:
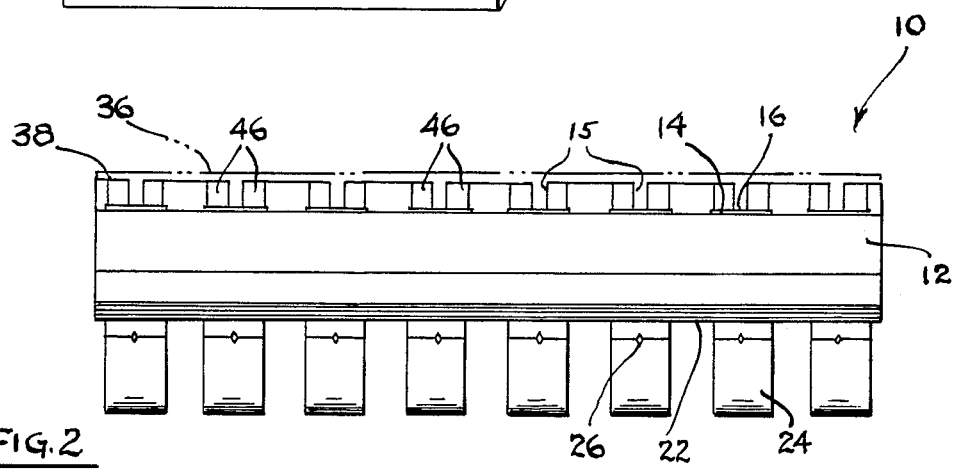
FIG. 2 is a top view of a connector constructed in accordance with the invention.
Figure 3:
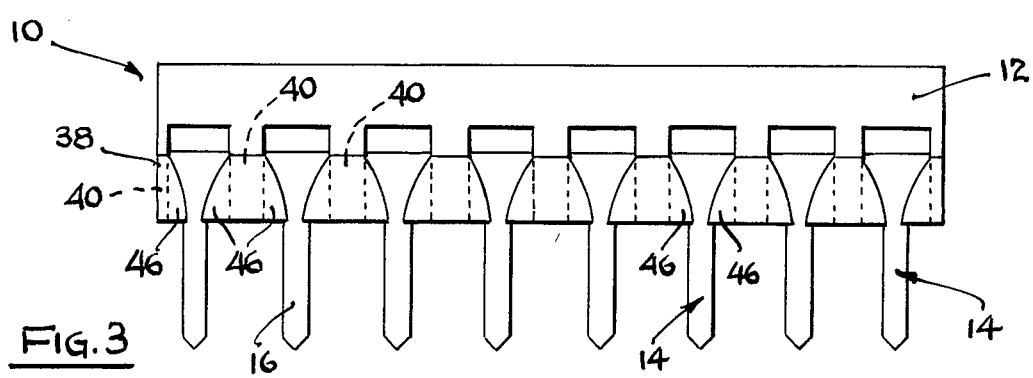
FIG. 3 is a rear view of the invention shown in FIG. 2.
Figure 4:
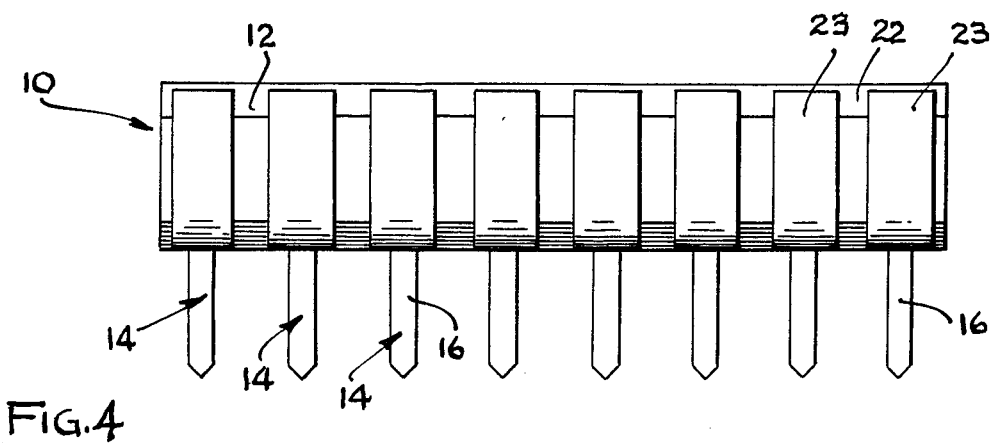
FIG. 4 is a front view of the invention shown in FIG. 2.

Referring to FIG. 2, the connector 10 includes a base block 12 of insulating material such as Valox 420 SEO (manufactured by General Electric) with a number of conductors 14 running therethrough and supported thereby. As the figures show, the base block 12 is quite long with respect to its other dimensions and may include, depending on the purpose for which the connector is intended, as many conductors 14 as are necessary for the particular integrated circuit to be connected. Each of the conductors 14 is bent to fit one of a plurality of parallel grooves 15 provided in the block 12 and has an end 16 which is adapted to fit through holes in the mother board 9 (not shown in FIG. 2) and be soldered thereto in a well known manner (such as wave soldering). Once the ends 16 have been soldered to the mother board, the projecting portions thereof will be clipped and removed from the circuit.

The conductor 14 projects as is shown in FIG. 5 from an upper corner of the base 12 where it is bent at approximately 135° to fit into the groove 15. It projects from a lower corner of the base 12 where it is bent again at a 45° angle so that a portion 18 is essentially parallel to a face 20 of the block 12 which will lie against the mother board 9. The conductor 14 is also bent at an essentially 90° angle so that it projects essentially parallel to a face 22 of the base 12 and is bent yet again at almost 180° to provide a contact arm 24 which is almost parallel to the face 22. The arm 24 carries a contact point 26 which makes connection with the terminal pads on the integrated circuit 11 to provide an electrical connection thereto when the integrated circuit 11 is pressed between the arms 24 and the face 22 of the base 12 as is shown in FIG. 1.

In a preferred embodiment, an integrated circuit 11 having a thickness of approximately 0.016 inches is supported by the connector 10 so that when it is inserted into place it is held firmly at each of its terminal pads by the contacts 26 due to the spring pressure provided by the arms 24 of the conductor 14. It will be appreciated that as the arm 24 is pressed outward by the insertion of a circuit 11 pressing against each of the contacts 26, the portion 23 of the conductor 14 is also moved outward and the portion 18 is pressed downward so that it lies firmly against the mother board 9 in alignment with the face 20 of the base 12. It will also be appreciated by those skilled in the art that the arm 18 provides a substantial support for the connector 10 and the integrated circuit 11 utilized therewith in its connection to the mother board 9.

The connector 10 of the present invention is constructed by providing a plurality of connectors 14 as a flat sheet which is inserted into a mold subsequently filled with the material of which the base block 12 is constructed. The dashed lines in FIG. 5 at 28 and 30 illustrate the initial position of the conductors 14 during the molding process. The sheet of conductors 14 has been formed in dies so that the contact points 26 and a projection 27 are formed on each conductor 14. When the molding has taken place, the connector 10 is removed from the mold and the portion 16 is bent about a projection 32 (shown in dashed lines in FIG. 5) so that the material of which the base 12 is constructed is actually pushed back in and fills underneath the conductor 14 as is shown at 34 in FIG. 5. Coincidentally, in the preferred embodiment, pressure is applied to a rear surface of the block 12 at 36 (shown by the dashed lines in FIG. 5) to distort the shape of the base block 12 and press the rear surface to the solid line at 38. This causes ribbed projections 40 (as shown by the dotted lines in FIG. 3) which are originally rectangular in shape to be pressed toward each other thereby filling in above the end 16 of the conductors 14 as shown at 46 in FIGS. 2 and 3 of the drawings.

Thus the base 12 is deformed to provide material both above the projecting terminals 16 and below the bend of the end 16 in each of the conductors 14. This provides very solid support, helps to eliminate vibration between the connector 10 and the mother board 9 when the connector 10 is mounted thereto, and also stabilizes the connector 10 for easy insertion into the mother board 9. A portion 35 of the base 12 adjacent each conductor 14 is relieved to facilitate bending the portion 16 flat against the base 12 while maintaining a satisfactory bend radius.

The rigidity of the connector is enhanced by the projection 27 on each of the conductors 14 which is better shown in FIG. 6. The projection 27 is formed as a cone shaped locking point 48 which in the preferred embodiment is created before molding by providing a force on the interior of the cone to force the projection 27 outwardly. This cone shaped point projecting from one surface of the conductor helps hold each of the conductors 14 firmly fixed in position within the base block 12 once the molding of the base block 12 takes place.

The contact point 26 on the contact arm 24 is shaped in a unique manner, as is shown in FIGS. 7 and 8, thereby to provide for a much more secure mechanical and electrical connection to an integrated circuit 11 than is common in the prior art. As may be seen from FIGS. 5, 7 and 8 the terminal 26 has a longer dimension parallel to the length of the arm 24 and a narrower dimension across the arm 24. This provides a shape much like the keel of a boat which has a sharp knife-like edge adapted to press into a terminal pad on an integrated circuit 11 along a substantial line rather than at a single point. This has a number of desirable effects. First, the sharp line provides a self cleaning action as the integrated circuit 11 is moved into place in the connector 10 which removes oxidation from the terminal pads on the circuit 11. The knife-like edge of the boat keel shape also provides a long surface pressing against the metallic pad on the integrated circuit 11 thereby providing a substantial line of contact with the pad for ease of insertion of the integrated circuit and for resisting shock at right angles to the arm 24. The keel-like shape of the terminal 26 provides a firm hold against the terminal pad along a long thin line which forms a narrow indentation in solder plate of the integrated circuit contact pads. The result is a substantially greater contact mating force on the pad conductive surface, which provides a reliable gas tight seal.

The connector of this invention is especially inexpensive. It is formed of but two inexpensive components, the flat sheet of conductors which have the projections 27 and the contacts 26 preformed as explained, and the body 12 of molded material. The process for forming is also quite simple and inexpensive. These factors combine to minimize the cost of this useful connector.

While a preferred embodiment of the invention has been shown and described, it is to be understood that various other adaptations and arrangements might be made by those skilled in the art which are within the spirit and scope of the invention.

What is claimed is:

1. A device for connecting a leadless flat circuit to a circuit board comprising an elongated body of insulating material having a first surface adapted to fit flush against a circuit board, a second surface adjacent the first surface having a series of parallel grooves, and a third surface; and a series of parallel conductors each molded into a central portion of the body of insulating material and bent to fit into one of the grooves in a manner that the insulating material underlying the bend is forced tightly thereagainst and the portion of the body which is grooved is forced tightly against the remaining portion of the conductor, the conductors protruding at one end from the first surface for connection to a circuit board and at the other end lying alongside the third surface and being bent to provide a spring to hold and make contact with the leadless flat circuit interposed between the conductors and the third surface, and in which each of the parallel conductors has a portion adjacent the end lying alongside the third surface which lies in the same plane as the first surface when the leadless flat circuit is held in place against the third surface.

2. A device as claimed in claim 1 in which each of the parallel conductors includes a projection therefrom within the body of insulating material.

3. A device as claimed in claim 1 in which each of the parallel conductors has a contact on the end thereof adjacent the third surface which is shaped like the keel of a boat.

* * * * *